United States Patent
Chen et al.

(10) Patent No.: US 9,653,669 B2
(45) Date of Patent: May 16, 2017

(54) LED PACKAGE STRUCTURE

(71) Applicants: LITE-ON OPTO TECHNOLOGY (CHANGZHOU) CO., LTD., Changzhou,Jiangsu Province (CN); LITE-ON TECHNOLOGY CORPORATION, Taipei (TW)

(72) Inventors: Chih-Yuan Chen, New Taipei (TW); Tien-Yu Lee, Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 15/220,294

(22) Filed: Jul. 26, 2016

(65) Prior Publication Data

US 2016/0336498 A1 Nov. 17, 2016

Related U.S. Application Data

(62) Division of application No. 14/818,355, filed on Aug. 5, 2015, now Pat. No. 9,455,387.

(30) Foreign Application Priority Data

Mar. 4, 2015 (CN) .......................... 2015 1 0096121

(51) Int. Cl.
| | |
|---|---|
| H01L 21/20 | (2006.01) |
| H01L 33/62 | (2010.01) |
| H01L 33/50 | (2010.01) |
| H01L 33/52 | (2010.01) |
| H01L 33/60 | (2010.01) |
| H01L 33/48 | (2010.01) |

(52) U.S. Cl.
CPC ............ *H01L 33/62* (2013.01); *H01L 33/501* (2013.01); *H01L 33/486* (2013.01); *H01L 33/504* (2013.01); *H01L 33/505* (2013.01); *H01L 33/52* (2013.01); *H01L 33/60* (2013.01); *H01L 2224/48091* (2013.01); *H01L 2224/85181* (2013.01); *H01L 2224/85186* (2013.01); *H01L 2924/12041* (2013.01); *H01L 2933/0041* (2013.01)

(58) Field of Classification Search
None
See application file for complete search history.

(56) References Cited

U.S. PATENT DOCUMENTS

2005/0224830 A1* 10/2005 Blonder ................ H01L 33/507
257/100

* cited by examiner

*Primary Examiner* — Michael Lebentritt
(74) *Attorney, Agent, or Firm* — Li & Cai Intellectual Property (USA) Office

(57) ABSTRACT

An LED package structure includes a base, an LED chip disposed on the base, at least one metal wire, a phosphor sheet, and an encapsulation resin disposed in the base and encapsulating the LED chip, the metal wire, and the phosphor sheet. The LED chip has at least one electrode thereon. The metal wire has an apex and a loop height being defined by the apex. The metal wire is electrically connected to the electrode and the base. The phosphor sheet includes a B-stage resin and a plurality of phosphor powders mixed therewith. The phosphor sheet is adhered to the LED chip by the B-stage resin capable of viscosity and covers the top surface, the side surface, and the electrode of the LED chip. A thickness of the phosphor sheet is smaller than the loop height, and the apex of the metal wire is exposed from the phosphor sheet.

20 Claims, 20 Drawing Sheets

LED PACKAGE STRUCTURE

The present application is a divisional application of co-pending application Ser. No. 14/818,355, filed on Aug. 5, 2015 and entitled "LED PACKAGE STRUCTURE AND MANUFACTURING METHOD THEREOF", now allowed. Moreover, this divisional application contains claims based on Invention H, according to the Restriction Requirement dated Mar. 23, 2016.

BACKGROUND OF THE INVENTION

1. Field of the Invention

The instant invention relates to an LED package structure; in particular, to an LED package structure that incorporates with a phosphor sheet.

2. Description of Related Art

Currently, applying the phosphor on the LED chip includes a dispensing method and a spray coating method. In the dispensing method, the problems of precipitation of phosphor powder and bad distribution of the CIE coordinate are happened to the LED package structure. In the spray coating method, a non-essential portion (e.g., a metal wire or an inner surface of base of the LED package structure), which does not need to be provided with any phosphor, is coated with the phosphor, such that the problems of low utilization of phosphor powder and the use of a toluene solvent, which is not environmentally friendly, are happened to the LED package structure.

SUMMARY OF THE INVENTION

The instant disclosure provides an LED package structure and a manufacturing method thereof, which incorporates a phosphor sheet with an LED chip that is electrically connected by wire bonding for effectively solving the problems of precipitation of phosphor powder, low utilization of phosphor powder, and the use of toluene solvent.

In summary, the phosphor sheet of the instant disclosure is configured to cover the outer surface of the LED chip and the electrode of the LED chip, so the LED chip can be provided without any light leakage by using the phosphor sheet, thereby avoiding the LED package structure being manufactured with bad color uniformity.

In order to further appreciate the characteristics and technical contents of the instant invention, references are hereunder made to the detailed descriptions and appended drawings in connection with the instant invention. However, the appended drawings are merely shown for exemplary purposes, rather than being used to restrict the scope of the instant invention.

DETAILED DESCRIPTION OF THE PREFERRED EMBODIMENTS

First Embodiment

Please refer to FIGS. 1A through 7B, which show a first embodiment of the instant disclosure. References are hereunder made to the detailed descriptions and appended drawings in connection with the instant invention. However, the appended drawings are merely shown for exemplary purposes, rather than being used to restrict the scope of the instant invention.

The instant embodiment provides a manufacturing method of an LED package structure. The manufacturing method includes the following steps S110 to S160. The following description discloses each step with reference to the corresponding figure.

Figure 1A:
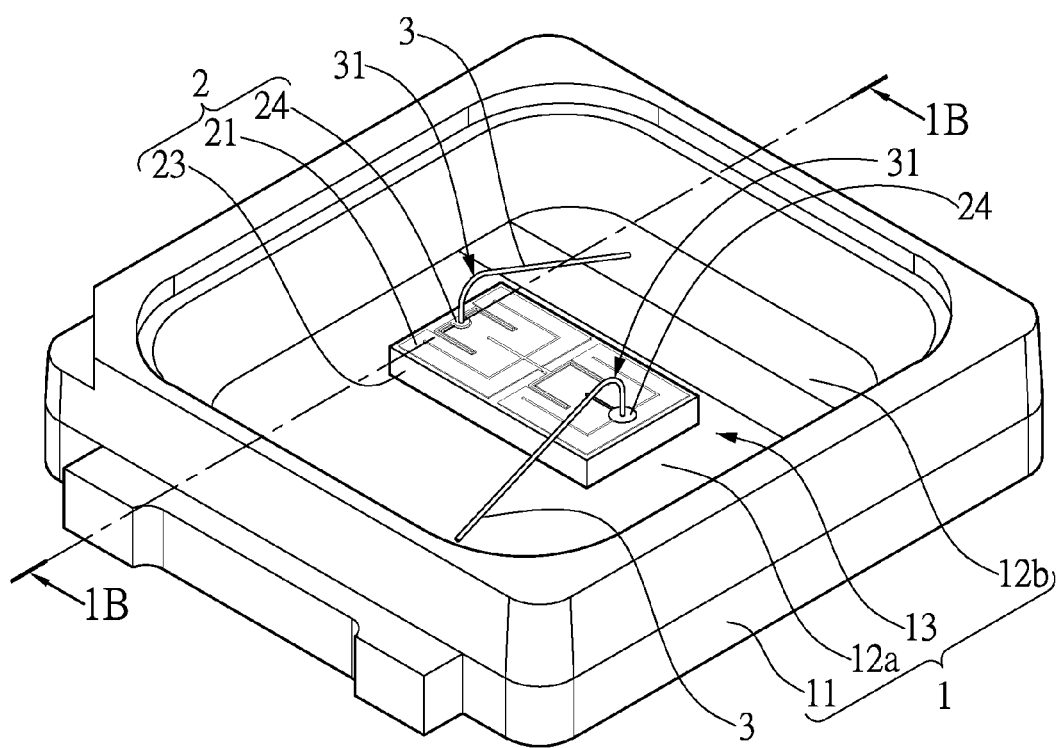
FIGS. 1A and 1B are perspective views showing step S110 of a manufacturing method of an LED package structure according to the instant disclosure.
Figure 1B:
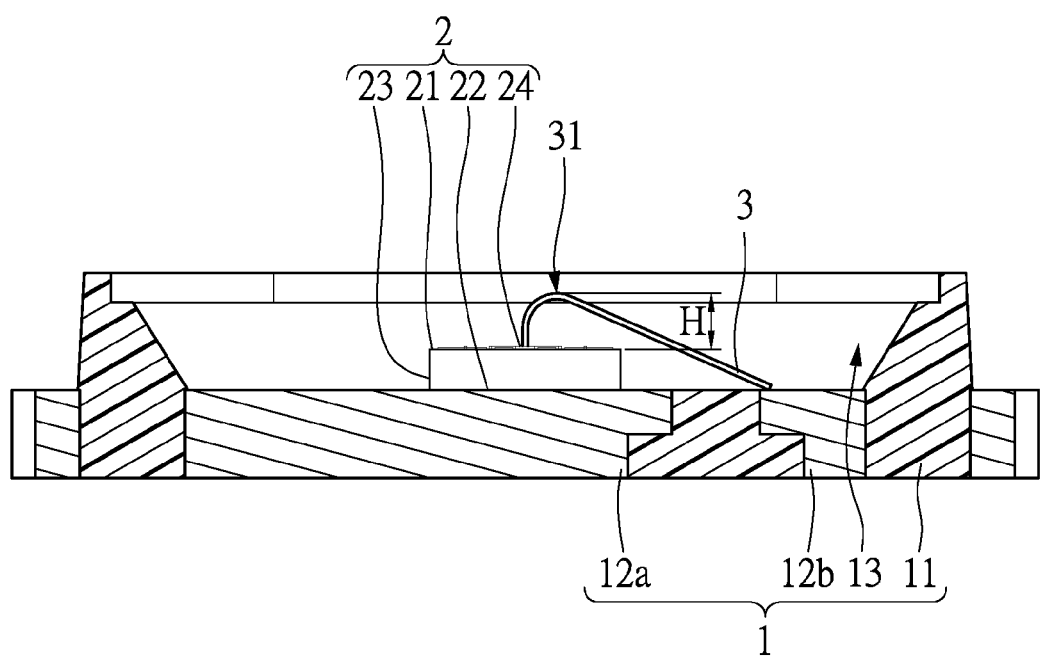

Please refer to FIGS. 1A and 1B. In Step S110, a base 1 is provided, and the base 1 in the instant disclosure is a bowl construction for example. The base 1 has a reflecting body 11 and a pair of lead frames. The pair of lead frames includes a first lead frame 12a and a second lead frame 12b arranged apart from each other and partially embedded in the reflecting body 11. The size of the first lead frame 12a is larger than that of the second lead frame 12b. An accommodating space 13 can be cooperatively defined by the reflecting body 11 and the first and second lead frames 12a, 12b. The first and second lead frames 12a, 12b exposed from the reflecting body 11 can be the bottom portion of the accommodating space 13. The first and second lead frames 12a, 12b are quad-flat no-lead (QFN) lead frames, and the proportion of the first lead frame 12a exposed from the reflecting body 11 to the bottom portion of the accommodating space 13 is greater than 50%. Two penetrating holes formed on the first and second lead frames 12a, 12b are provided for being firmly fixed the reflecting body 11 with the first and second lead frames 12a, 12b. The base 1 of the instant embodiment is just an example, and it is not limited to the figures.

And then, at least one LED chip 2 is disposed on the base 1. The LED chip 2 includes a top surface 21, a bottom surface 22, and a side surface 23 arranged between the top surface 21 and the bottom surface 22. The LED chip 2 in the instant embodiment is a horizontal chip, which means that two electrodes 24 of the LED chip 2 are arranged on the top surface 21 of the LED chips and are spaced apart from each other. The LED chip 2 is arranged in the accommodating space 13 and the bottom surface 22 of the LED chip 2 is fixed on the lead frame 12a of the base 1.

After that, the two electrodes 24 of the LED chip 2 are electrically connected to the two lead frames 12a, 12b of the base 1 by two metal wires 3. Specifically, one end of one of the two metal wires 3 is connected to the one of two electrodes 24 of the LED chip 2, and the other end of one of the two metal wires 3 is connected to one of the first and second lead frames 12a, 12b of the base 1. One end of the other one of the two metal wires 3 is connected to the other one of two electrodes 24 of the LED chip 2, and the other end of the other one of the two metal wires 3 is connected to the other one of the first and second lead frames 12a, 12b of the base 1. Therefore, the LED chip 2 can be electrically connected to the two lead frames 12a, 12b of the base 1 by the two metal wires 3.

Moreover, each of the metal wires 3 has a parabolic shape, and each of the metal wires 3 has an apex 31 arranged at a turning point of the parabolic shape. A height between the bottom portion of the accommodating space 13 and the apex 31 is greater than a height between the bottom portion of the accommodating space 13 and the top surface 21 of the LED chip 2 (i.e., the thickness of the LED chip 2), and a height between the apex 31 and the top surface 21 of the LED chip 2 is defined as a loop height H. The loop height H of the metal wire 3 bonding by forward bonding for the square loop in the instant embodiment is greater than 6 mil.

In addition, the LED chip 2 in the instant embodiment is a horizontal chip for example. However, the LED chip 2 also can be a vertical chip in another non-shown embodiment. Specifically, when the LED chip (not shown) is the vertical chip, the top surface and the bottom surface of the LED chip respectively have an electrode thereon. The LED chip is arranged in the accommodating space, the electrode arranged on the bottom surface of the LED chip is electrically connected to one of the lead frames, and the electrode arranged on the top surface of the LED chip is electrically connected to another lead frame by a metal wire.

Figure 2:
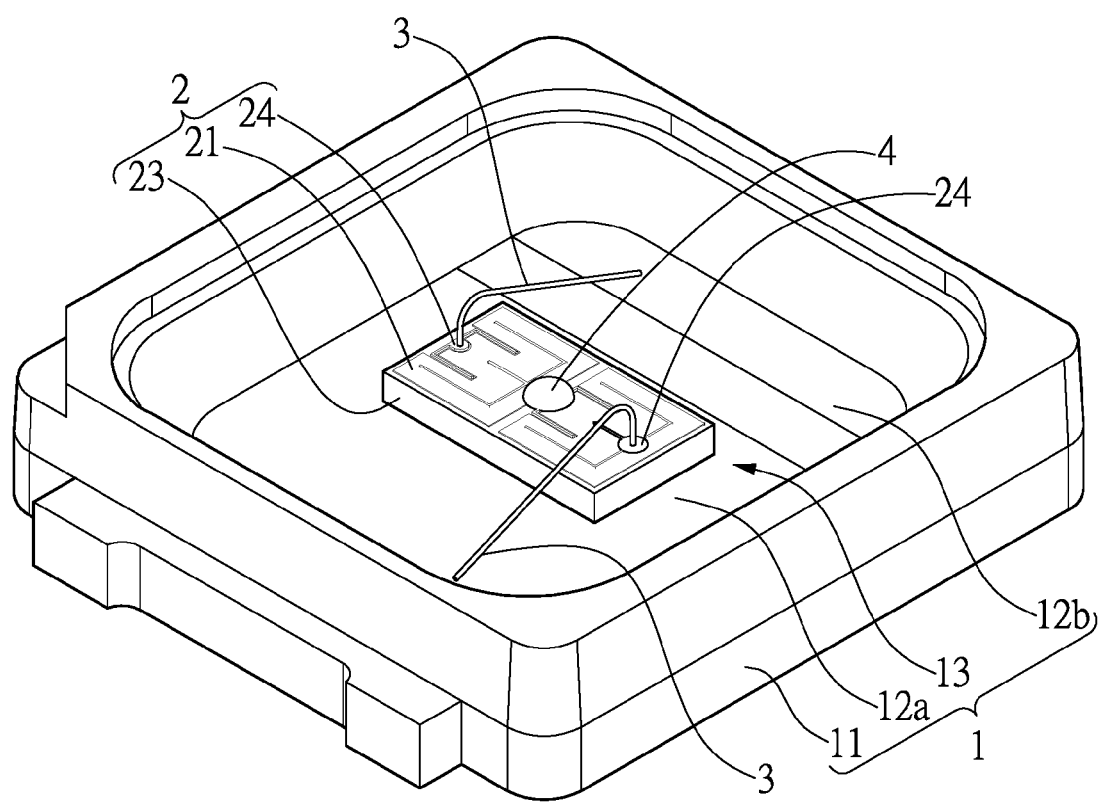
FIG. 2 is a perspective view showing step S120 of the manufacturing method of the LED package structure.

Please refer to FIG. 2. In Step S120, a glue 4 is disposed on the top surface 21 of the LED chip 2, the glue 4 in the instant embodiment is disposed on the top surface 21 of the LED chip 2 by a dispensing method, and the glue 4 is approximately arranged on the center of the top surface 21 of the LED chip 2, but is not limited thereto. The viscosity of the glue 4 is smaller than 10000 cP, the refractive index of the glue 4 with respect to light having a wavelength of 532 nm is 1.54, and the glue 4 in the instant embodiment is a phenylsiloxane resin capable of low viscosity for example. The glue 4 formed on the LED chip 2 has a thickness of about 100 μm, and the amount of the glue 4 is approximately equal to the area of the top surface 21 of the LED chip 2 multiplied by the thickness of the glue 4.

Figure 3A:
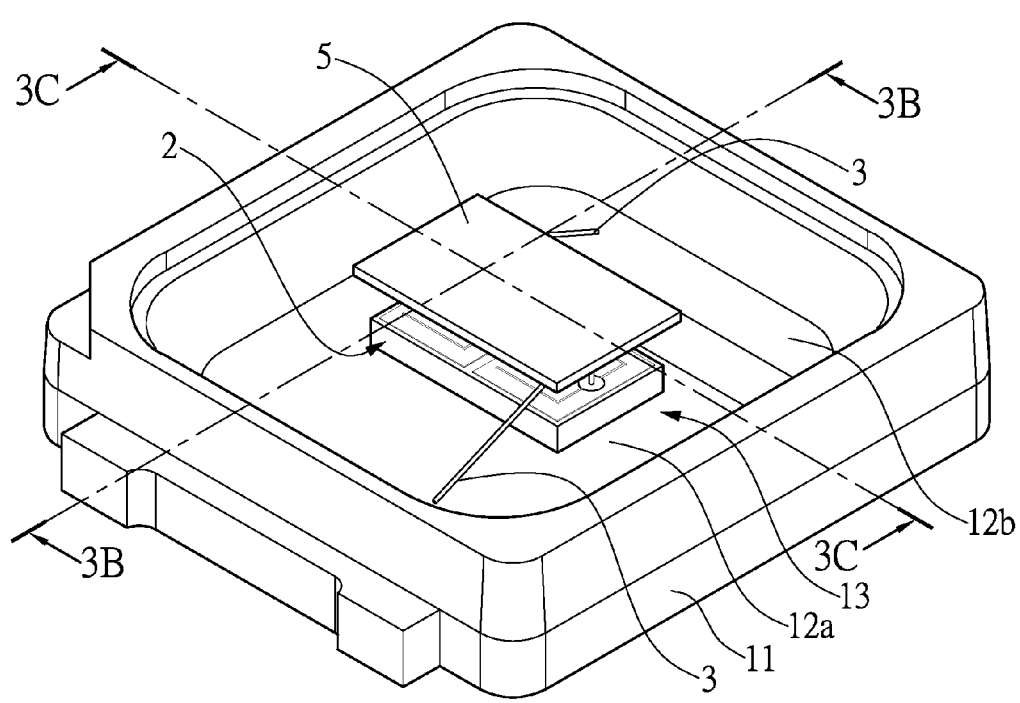
FIGS. 3A, 3B and 3C are perspective views showing step S130 of the manufacturing method of the LED package structure.
Figure 3B:
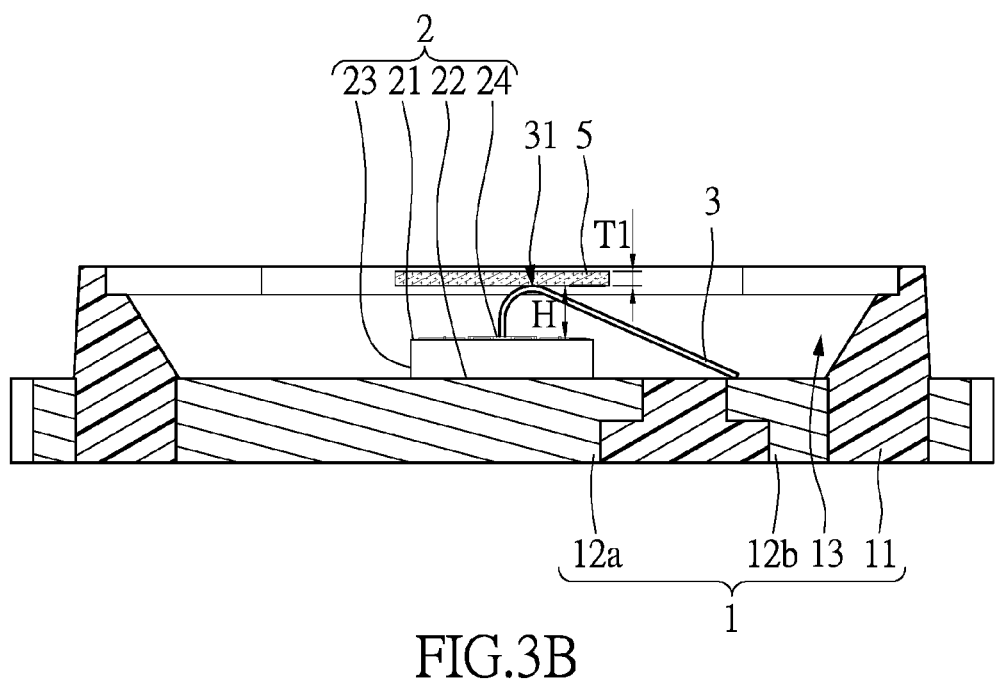
Figure 3C:
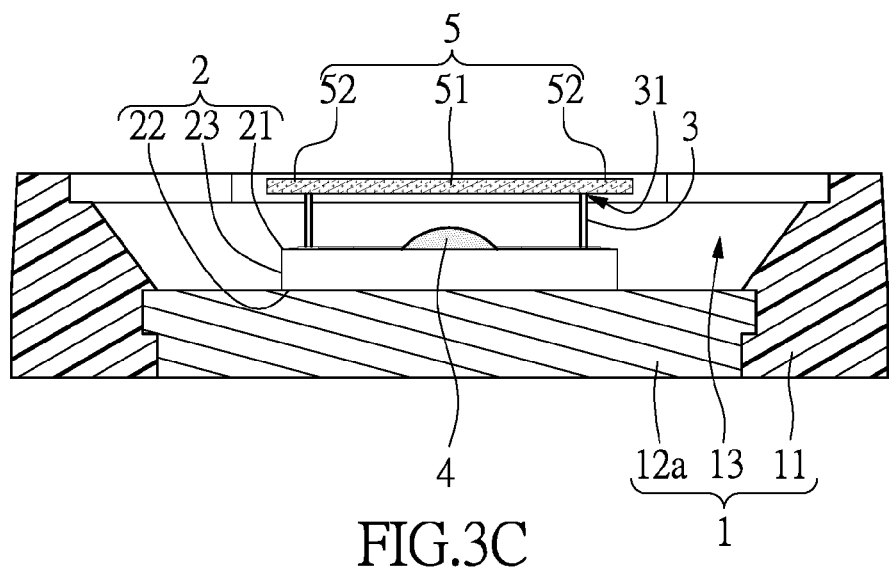

Please refer to FIGS. 3A through 3C. In Step S130, a first phosphor sheet 5, which has a thickness Ti smaller than the loop height H, is chosen to flatly dispose on the apexes 31 of the two metal wires 3. The first phosphor sheet 5 is formed by mixing a plurality of first phosphor powders (not labeled) with a B-stage resin (not labeled), and the B-stage resin can be softened by heating. Moreover, the viscosity of the B-stage resin is smaller than 10000 cP, the refractive index of the B-stage resin with respect to light having a wavelength of 532 nm is 1.56, and the B-stage resin in the instant embodiment is a phenylsiloxane resin capable of low viscosity for example.

Specifically, the first phosphor sheet 5 provided by the instant embodiment does not need to have any receiving hole for receiving the electrodes 24 of the LED chip 2. The area of the first phosphor sheet 5 is preferably larger than a sum of the area of the top surface 21 and the area of the side surface 23 of the LED chip 2. When the first phosphor sheet 5 is disposed on the apexes 31 of the two metal wires 3, the LED chip 2 is entirely disposed within a region of the base 1 defined by orthogonally projecting the first phosphor sheet 5 onto the bottom portion of the accommodating space 13, and structural strength of the two metal wires 3 must be strong enough to support the first phosphor sheet 5 without any deformation. Namely, the structural strength of the two metal wires 3 is larger than that of the first phosphor sheet 5.

In order to clearly explain the following step S140, the first phosphor sheet 5 is pressed downwardly to adhere to the LED chip 2 that is electrically connected to a pair of lead frames 12a, 12b by bonding at least one wire 3. Specifically, the first phosphor sheet 5 can be defined as a bonding portion 51 arranged on the center thereof and a bent portion 52 arranged outside the bonding portion 51. The bonding portion 51 is substantially arranged above the center portion of the top surface 21 of the LED chip 2 and arranged between the electrodes 24 of the LED chip 2. That is to say, the glue 4 is arranged under the bonding portion 51, and a portion of the first phosphor sheet 5 excluding the bonding portion 51 is the bent portion 52.

Figure 4A:
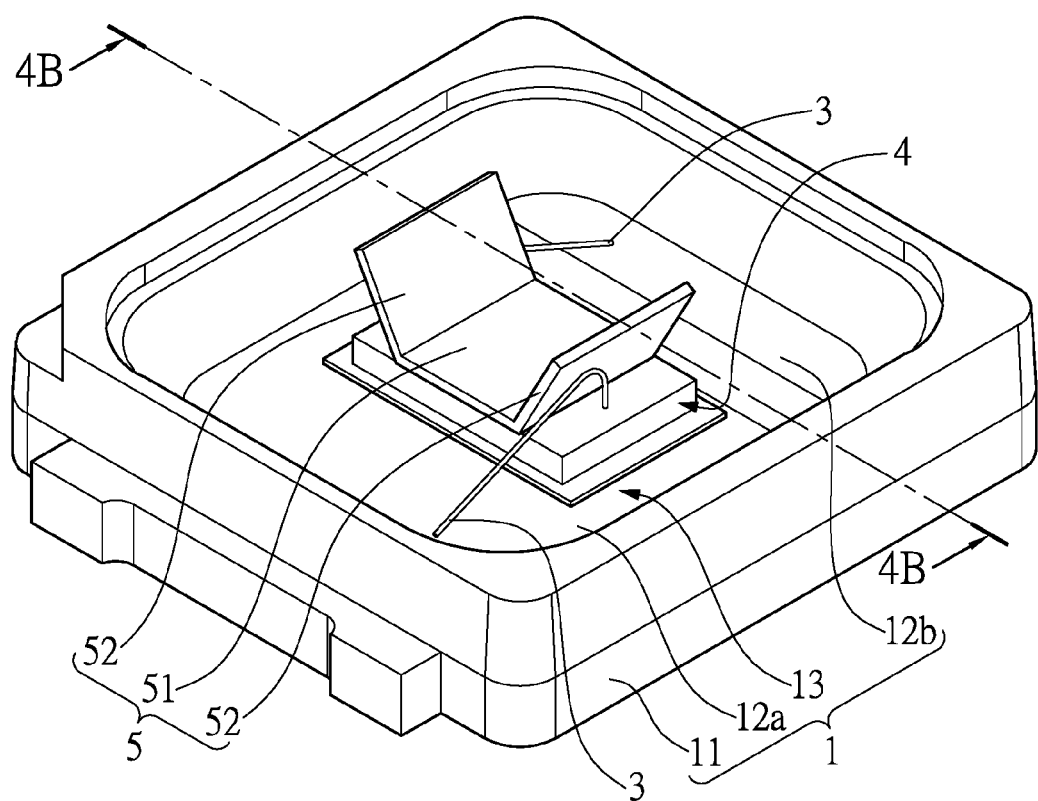
FIGS. 4A and 4B are perspective views showing step S140 of the manufacturing method of the LED package structure.
Figure 4B:
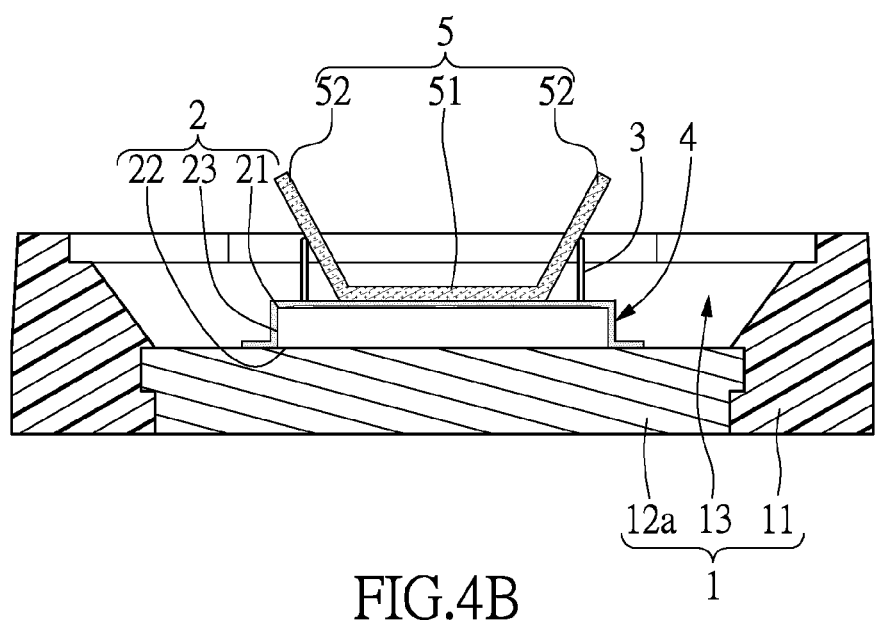

Please refer to FIGS. 4A and 4B. In Step S140, the bonding portion 51 of the first phosphor sheet 5 arranged between the two electrodes 24 of the LED chip 2 is pressed toward the top surface 21 of the LED chip 2 to adhere to the top surface 21 of the LED chip 2. The bent portion 52 abuts against the two metal wires 3 so as to be bent during the pressing of the bonding portion 51. Thus, the glue 4 is squeezed and flows outwardly along the top surface 21 and the side surface 23 by the bonding portion 51 of the first phosphor sheet 5, thus the glue 4 is formed as a layer construction covering the top surface 21 and the side surface 23 of the LED chip 2. When the amount of the glue 4 is too much, the glue 4 will further flow to the bottom of the LED chip 2 or the bottom portion of the accommodating space 13. The thickness of the layer construction of the glue 4 in the instant embodiment is smaller than 1 mm.

The structural strength of the two metal wires 3 must be strong enough to bend the bent portion 52 without any deformation during the pressing of the bonding portion 51. Moreover, when the bonding portion 51 of the first phosphor sheet 5 arranged between the two electrodes 24 of the LED chip 2 abuts against the center portion of the top surface 21 of the LED chip 2, the bonding portion 51 of the first phosphor sheet 5 is adhered to the center portion of the top surface 21 by the property of viscosity thereof. Furthermore, the bonding portion 51 and the center portion of the top surface 21 can be combined more firmly by the glue 4 when the glue 4 is disposed on the top surface 21 of the LED chip 2.

Figure 5A:
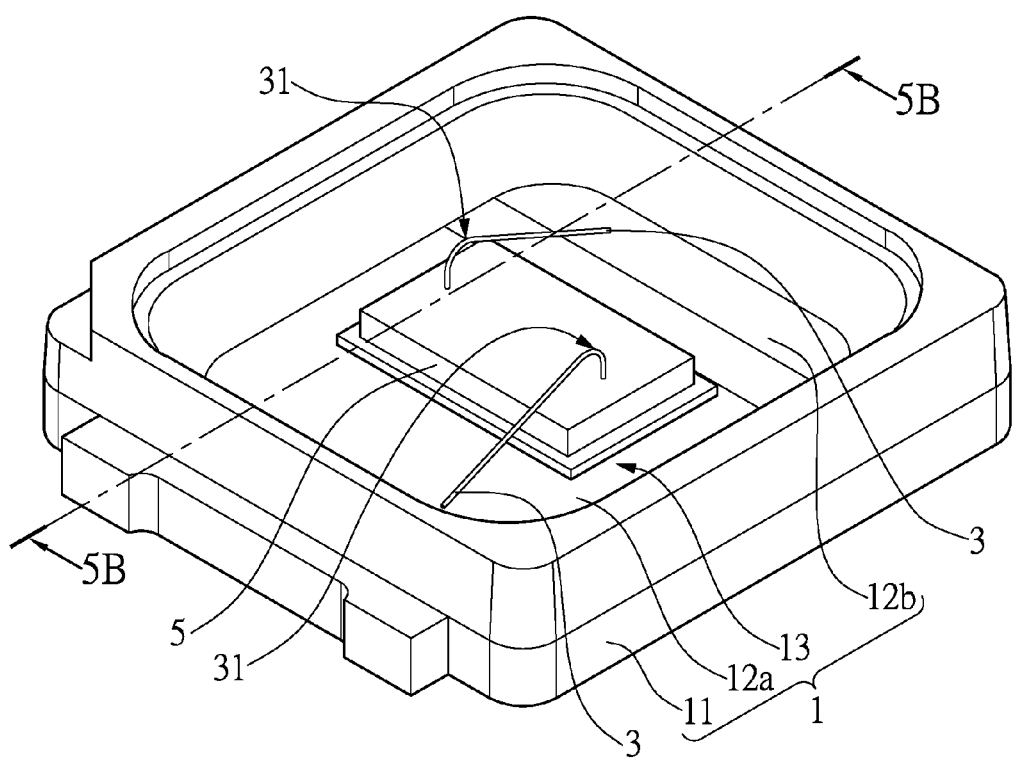
FIGS. 5A and 5B are perspective views showing step S150 of the manufacturing method of the LED package structure.
Figure 5B:
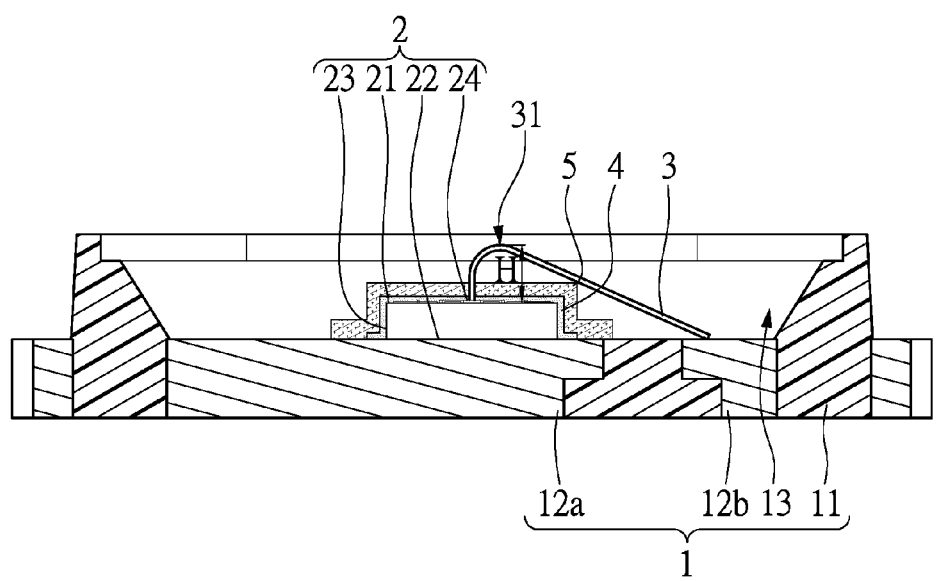

Please refer to FIGS. 5A and 5B. In Step S150, a baking process is implemented to heat the first phosphor sheet 5 (i.e., in a heating condition about 50~80° C.), such that the first phosphor sheet 5 is softened to flow along the top surface 21 and the side surface 23, and/or further to flow to the bottom portion of the accommodating space 13, thereby entirely covering the top surface 21, the side surface 23, and the electrodes 24 of the LED chip 2 and/or covering the bottom portion of the accommodating space 13 (as shown in FIG. 5B). And then, the softened first phosphor sheet 5 is solidified to cover the LED chip 2.

Figure 5C:
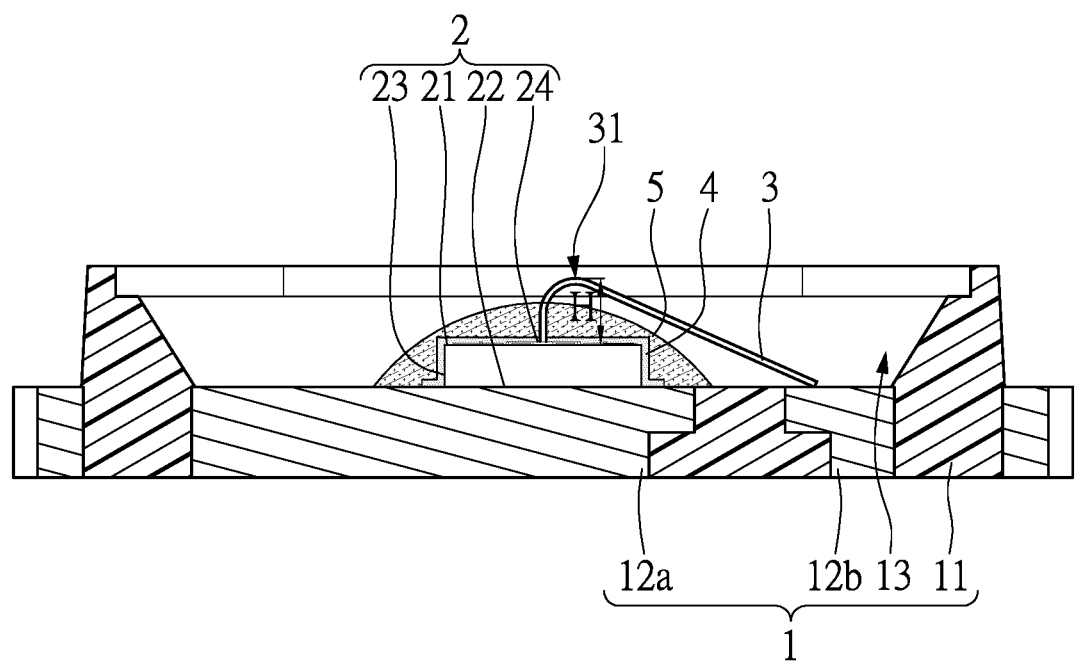
FIG. 5C is a perspective view of the LED package structure having a soft first phosphor sheet.

Additionally, when the phosphor sheet bonded on the LED chip 2 is chosen by different hardness, the phosphor sheets will be formed into different shapes. As shown in FIG. 5B, when a hard first phosphor sheet 5 is applied on the LED chip 2, the shape of the first phosphor sheet 5 is corresponding to the shape of the LED chip 2, so the first phosphor sheet 5 is solidified to form as a step construction, thus the first phosphor sheet 5 is configured as a cover to entirely shield the LED chip 2. As shown in FIG. 5C, when a soft first phosphor sheet 5 is applied on the LED chip 2, the shape of the first phosphor sheet 5 is not corresponding to the shape of the LED chip 2, the first phosphor sheet 5 is solidified to form as a hemisphere construction, thus first phosphor sheet 5 is configured to entirely shield the LED chip 2. Based on the above description, the first phosphor sheet 5 is formed by mixing the first phosphor powders with the B-stage resin, so the hardness of the first phosphor sheet 5 can be adjusted by changing the composition of the B-stage resin.

Specifically, the softened first phosphor sheet 5 in melt state flows along the outer surface of the LED chip 2, so the apexes 31 of the metal wires 3 are exposed from the first phosphor sheet 5. When the parabolic shape of the metal wire 3 has a precipitous slope (for example, the metal wire 3 is a Q loop as shown in FIG. 5A) in comparison to the top surface 21 of the LED chip 2, the flowing of the softened first phosphor sheet 5 in melt state will be influenced by the metal wires 3. Accordingly, the glue 4 capable of the viscosity lower than 10000 cP can be chosen to improve the flowing of the soften first phosphor sheet 5, thereby the top surface 21, the two electrodes 24, and the side surface 23 of the LED chip 2 can be uniformly and entirely covered by the first phosphor sheet 5. A covering state can be defined by that the LED chip 2 is covered by the first phosphor sheet 5 after the baking process. When the first phosphor sheet 5 is in the covering state, a height between the top surface of the first phosphor sheet 5 and the bottom portion of the accommodating space 13 is smaller than a height between the apex 31 and the bottom portion of the accommodating space 13. That is to say, the apex 31 of the metal wires 3 is exposed from the first phosphor sheet 5.

Figure 6A:
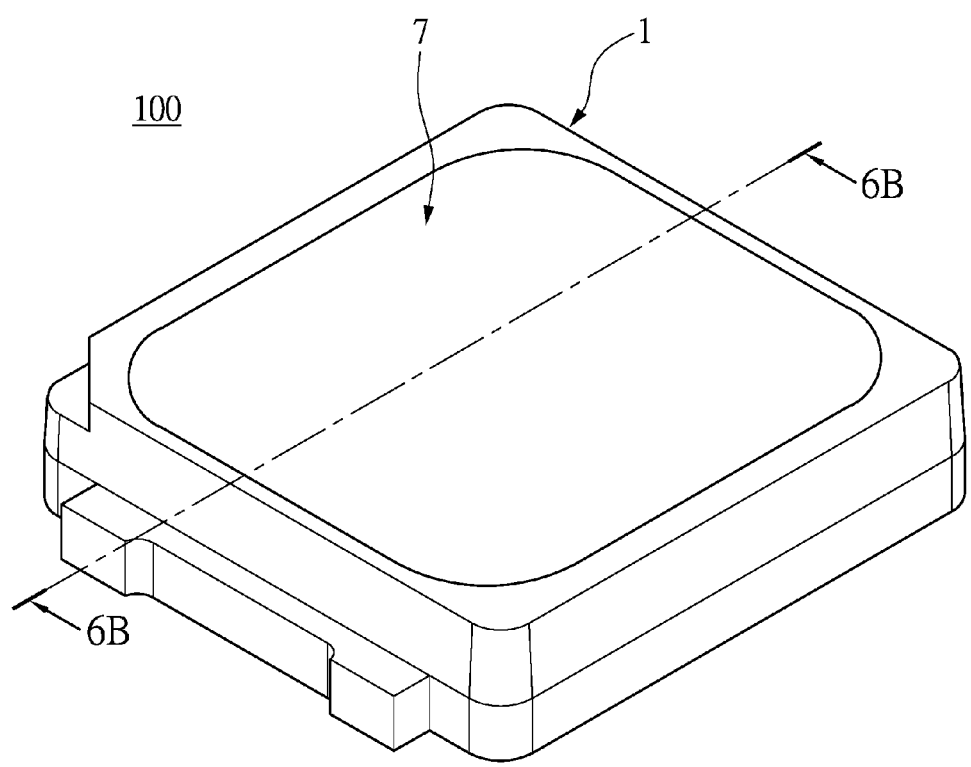
FIGS. 6A and 6B are perspective views showing step S160 of the manufacturing method of the LED package structure.
Figure 6B:
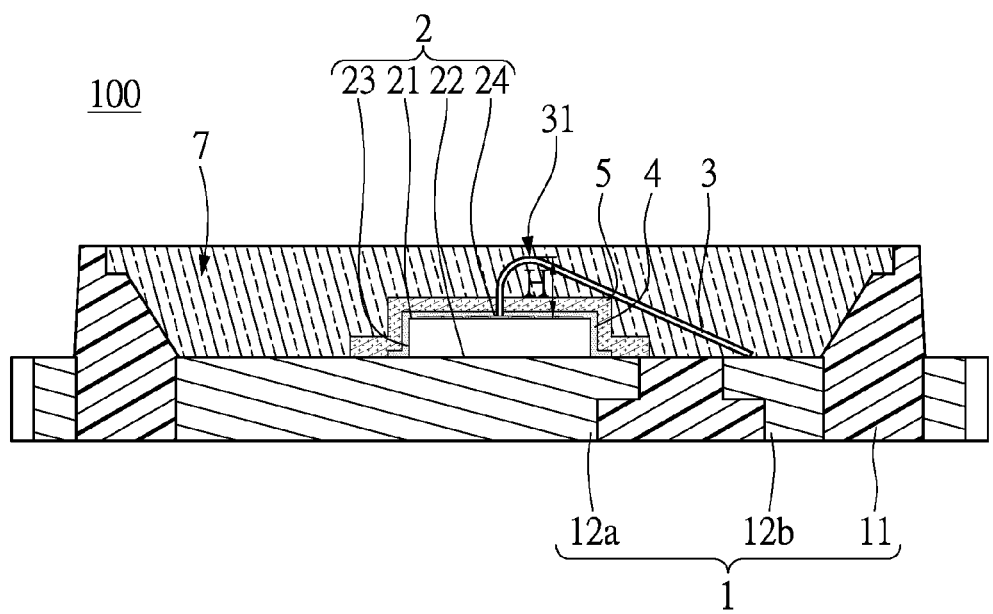

Please refer to FIGS. 6A and 6B. In Step S160, an encapsulation resin 7 is arranged in the accommodating space 13 of the base 1 to encapsulate the LED chip 2, the metal wires 3, and the first phosphor sheet 5, whereby an LED package structure 100 has been prepared. Moreover, in the instant embodiment, the LED chip 2 of the LED package structure 100 is configured to emit blue light, the first phosphor sheet 5 has yellow phosphor powders, so the blue light emitted from the LED chip 2 can be transformed into white light after passing through the first phosphor sheet 5.

Additionally, the instant disclosure takes the above steps S110~S160 as an example, but the steps S110~S160 can be adjusted to different requests, such as the following description.

Figure 7A:
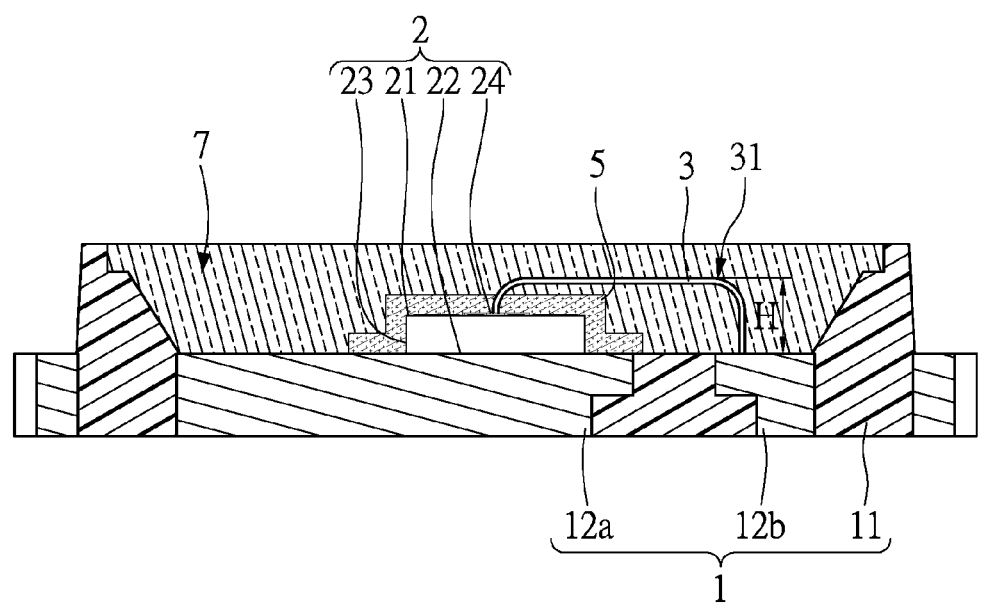
FIG. 7A is a perspective view showing the LED package having the metal wires with a reverse loop.
Figure 7B:
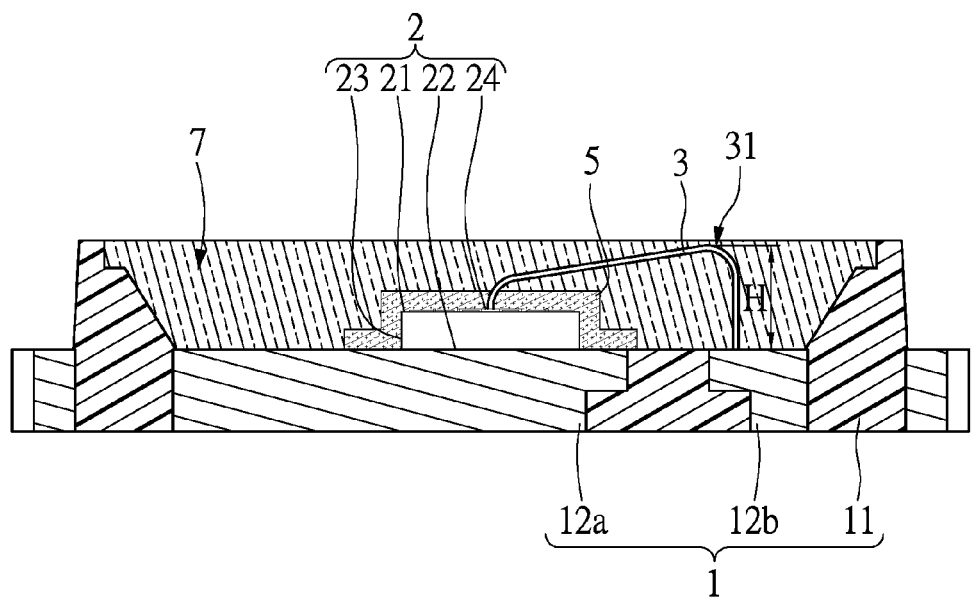
FIG. 7B is a perspective view showing the LED package having the metal wires with a square loop.

As shown in FIG. 7A, when the parabolic shape of the metal wire 3 has a flat slope (for example, the metal wire 3 is a reverse loop as shown in FIG. 7A) in comparison to the top surface 21 of the LED chip 2, the flowing of the softened first phosphor sheet 5 in melt state is slightly influenced by the metal wires 3. Thus, the glue 4 is not needed to be used, and the step S140 of adhering the bonding portion 51 of the first phosphor sheet 5 to the top surface 21 of the LED chip 2 is just by the viscosity thereof, so that the step S120 of disposing the glue 4 can be omitted. The loop height H of the metal wire 3 for the reverse loop is defined by a height between the apex 31 of the metal wire 3 and the bottom portion of the accommodating space 13 (e.g., one end of the metal wire 3 is connected to the base 1), and the loop height H of the metal wire 3 bonding by reverse bonding for the reverse loop in the instant embodiment is smaller than 6 mil. Moreover, the metal wire 3 can be a square loop as shown in FIG. 7B. The apex 31 of the metal wire 3 as shown in FIGS. 7A and 7B is arranged above the lead frame 12b, and not arranged above the LED chip 2, thus when the first phosphor sheet 5 is in the bending mode (i.e., in a condition of a bonding portion 51 of the first phosphor 5 sheet is adhered to the LED chip 2, and a bent portion 52 of the first phosphor sheet 5 is bent by abutting against the at least one metal wire 3), the apex 31 of the metal wire 3 is not contacted with the first phosphor sheet 5.

After the appropriate first phosphor sheet 5 is chosen, the bonding portion 51 of the first phosphor sheet 5 is directly pressed toward the top surface 21 of the LED chip 2 to adhere the first phosphor sheet 5 onto the top surface 21 of the LED chip. Therefore, the step of disposing the first phosphor sheet 5 on the apexes 31 of the two metal wires 3 can be omitted due to the appropriate choice of the first phosphor sheet 5.

The manufacturing method of the LED package structure 100 is disclosed in the above description, and the LED package structure 100 prepared by the above manufacturing method is disclosed thereafter.

Figure 6C:
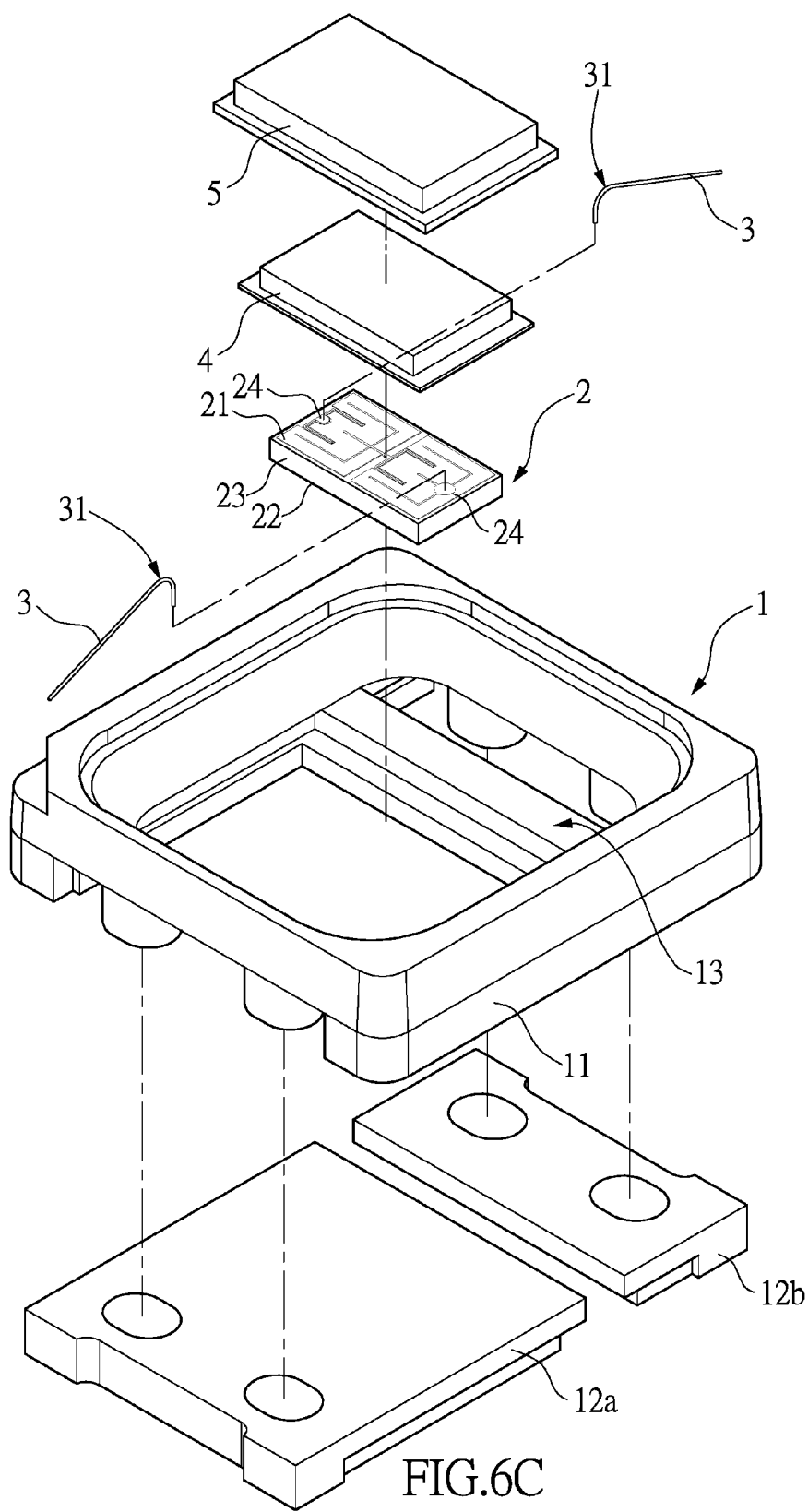
FIG. 6C is an exploded view of FIG. 6A without the encapsulation resin.

Please refer to FIGS. 6A through 6C, which show an LED package structure 100. The LED package structure 100 includes a base 1, an LED chip 2 disposed on the base 1, at least one metal wire 3 electrically connected the LED chip 2 to the base 1, a first phosphor sheet 5 covering the LED chip 2, a glue 4 arranged on the LED chip 2 for adhering the first phosphor sheet 5, and an encapsulation resin 7.

The base 1 in the instant disclosure is a bowl construction for example. The base 1 has a reflecting body 11 and a pair of lead frames 12a, 12b arranged apart from each other and partially embedded in the reflecting body 11. An accommodating space 13 can be cooperatively defined by the reflecting body 11 and the pair of lead frames 12a, 12b. Part of the pair of lead frames 12a, 12b can be formed as the bottom portion of the accommodating space 13. However, the base 1 of the instant embodiment is not limited to the figures.

The LED chip 2 includes a top surface 21, a bottom surface 22, and a side surface 23 arranged between the top surface 21 and the bottom surface 22. The LED chip 2 in the instant embodiment is a horizontal chip, so the top surface 21 of the LED chip 2 has two electrodes 24 arranged apart from each other. The bottom surface 22 of the LED chip 2 is fixed on the first lead frame 12a of the base 1 and is arranged in the accommodating space 13. The LED chip 2 in the instant embodiment is a horizontal chip for example, but the LED chip 2 can be a vertical chip in another non-shown embodiment. Specifically, when the LED chip (not shown) is the vertical chip, the top surface and the bottom surface of the LED chip each has an electrode. The LED chip is arranged in the accommodating space, the electrode arranged on the bottom surface of the LED chip is electrically connected to one of the lead frames, and the electrode arranged on the top surface of the LED chip is electrically connected to another lead frame by at least one metal wire.

One end of the metal wire 3 is respectively connected to the electrode 24 of the LED chip 2, and the other end of the metal wire 3 is connected to the one of the first and second lead frames 12a, 12b of the base 1. Moreover, the metal wire 3 has a parabolic shape, and an apex 31 of the metal wire 3 is arranged at a turning point of the parabolic shape. A height between the bottom portion of the accommodating space 13 and the apex 31 is greater than a height between the bottom portion of the accommodating space 13 and the top surface 21 of the LED chip 2 (i.e., the thickness of the LED chip 2), and a height between the apex 31 and the top surface 21 of the LED chip 2 is defined as a loop height H. The loop height H of the metal wire 3 bonded by forward bonding for the square loop in the instant embodiment is greater than 6 mil.

The first phosphor sheet 5 is formed by mixing a plurality of first phosphor powders (not labeled) with a B-stage resin (not labeled), and the B-stage resin can be softened in melt state by heating. Moreover, the viscosity of the B-stage resin is smaller than 10000 cP, the refractive index of the B-stage resin with respect to light having a wavelength of 532 nm is 1.56, and the B-stage resin in the instant embodiment is a phenylsiloxane resin capable of low viscosity for example. The top surface 21, the side surface 23, the two electrodes 24 of the LED chip 2, and/or a portion of the bottom portion of the accommodating space 13 arranged close to the LED chip 2 are entirely covered by the first phosphor sheet 5. When the LED chip 2 is covered by the first phosphor sheet 5 (i.e., in the covering state), the apex 31 is exposed from the first phosphor sheet 5 in the covering state.

The viscosity of the glue 4 is smaller than 10000 cP, the refractive index of the glue 4 with respect to light having a wavelength of 532 nm is 1.54, and the glue 4 in the instant embodiment is a phenylsiloxane resin capable of low viscosity for example. Moreover, the glue 4 is arranged on the LED chip 2 for adhering the first phosphor sheet 5 onto the LED chip 2, so the first phosphor sheet 5 can be firmly adhered to the LED chip 2 by the glue 4. If the first phosphor sheet 5 can be firmly adhered to the LED chip 2 by the physical property of viscosity thereof, the glue 4 can be omitted.

The encapsulation resin 7 is arranged in the accommodating space 13 of the base 1 by a dispensing method or a molding method, and the LED chip 2, the metal wires 3, and the first phosphor sheet 5 can be encapsulated by the encapsulation resin 7.

Second Embodiment

Please refer to the FIGS. 8 through 10B, which show a second embodiment of the instant disclosure. The second embodiment is similar to the first embodiment, so the same features are not disclosed again (i.e., the steps S210, S220, S260 of the second embodiment are respectively identical to the steps S110, S120, S160 of the first embodiment). The main difference of the two embodiments is that the second embodiment adding a second phosphor sheet 6 therein. In order to clearly disclose the said different feature, the figures of the second embodiment are cross-sectional views to clearly show the different feature, and the different feature is disclosed as follows.

Figure 8:
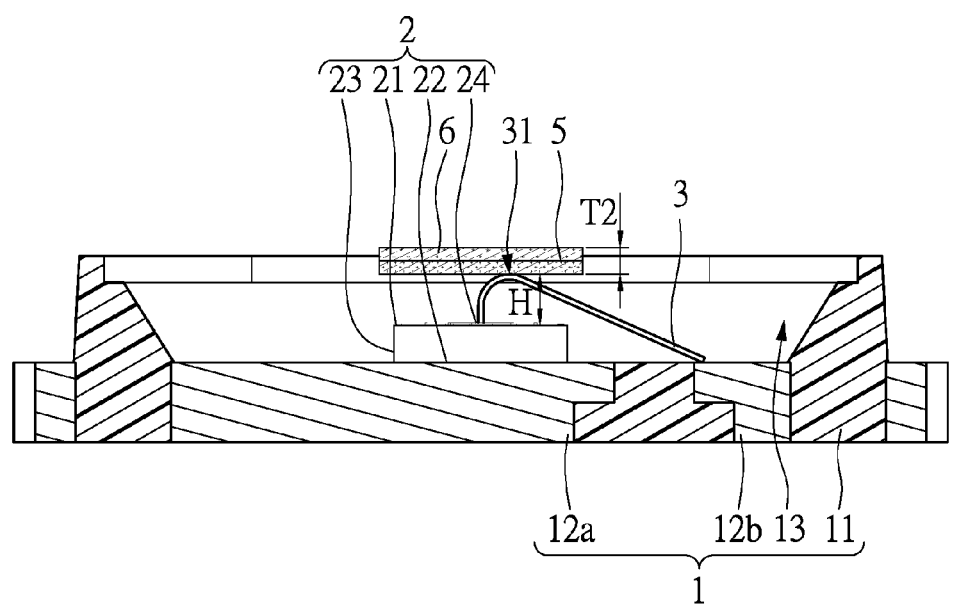
FIG. 8 is a perspective view showing step S230 of the manufacturing method of the LED package structure.

Please refer to FIG. 8. In Step S230, a thickness T2 of the first phosphor sheet 5 and a second phosphor sheet 6, which is smaller than the loop height H, are chosen. The second phosphor sheet 6 is disposed on the first phosphor sheet 5, and the first phosphor sheet 5 and the second phosphor sheet 6 are flatly disposed on the apexes 31 of the two metal wires 3. The second phosphor sheet 6 is formed by mixing a plurality of second phosphor powders (not labeled) with a B-stage resin (not labeled), and the B-stage resin can be softened in melt state by heating. The physical property of the second phosphor sheet 6 is different from that of the first phosphor sheet 5. For example, the optical property of the second phosphor sheet 6 is different from that of the first phosphor sheet 5. In other words, the material, the concentration of phosphor powder, and the thickness of the second phosphor sheet 6 are different from that of the first phosphor sheet 5. Moreover, the material of the resin of the second phosphor sheet 6 is substantially identical to that of the resin of the first phosphor sheet 5.

Specifically, the receiving hole of the second phosphor sheet 6 in the instant embodiment is not needed to be provided for receiving the electrodes 24 of the LED chip 2. The area of the second phosphor sheet 6 is preferably larger than a sum area of the top surface 21 and the side surface 23 of the LED chip 2. When the first phosphor sheet 5 and the second phosphor sheet 6 are disposed on the apexes 31 of the two metal wires 3, the LED chip 2 is entirely disposed within a region of the base 1 defined by orthogonally projecting the first phosphor sheet 5 and the second phosphor sheet 6 onto the bottom portion of the accommodating space 13. Specifically, the structural strength of the two metal wires 3 must be strong enough to support the first phosphor sheet 5 and the second phosphor sheet 6 without any deformation.

Figure 9:
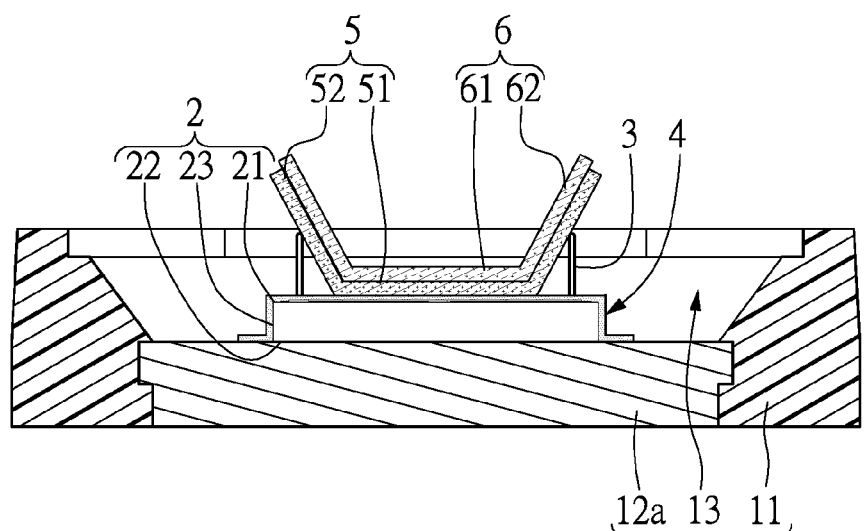
FIG. 9 is a perspective view showing step S240 of the manufacturing method of the LED package structure.

Moreover, a bonding portion 61 of the second phosphor sheet 6 arranged on the center thereof and a bent portion 62 arranged outside the bonding portion 61 (as shown in FIG. 9) can be defined when the second phosphor sheet 6 is pressed to be a bending mode. The bonding portion 61 is approximately arranged above the center portion of the top surface 21 of the LED chip 2 and arranged between the electrodes 24 of the LED chip 2. That is to say, the glue 4 is arranged under the bonding portion 61, and a portion of the second phosphor sheet 6 excluding the bonding portion 61 is the bent portion 62.

Please refer to FIG. 9. In Step S240, the bonding portion 61 of the second phosphor sheet 6 is pressed to move the two bonding portions 51, 61 toward the top surface 21 of the LED chip 2, thus the bonding portion 51 is adhered to the top surface 21 of the LED chip and the two bonding portions 51, 61 are arranged between the two electrodes 24 of the LED chip 2. The bent portions 52, 62 abut against the two metal wires 3 so as to be bent with respect to the bonding portions 51, 61 during the pressing of the bonding portion 61. Thus, the glue 4 is squeezed and outwardly flows along the top surface 21 and the side surface 23 of the LED chip 2 by the bonding portion 51 of the first phosphor sheet 5, and the glue 4 further flows to the bottom of the LED chip 2 or the bottom portion of the accommodating space 13 when the amount of the glue 4 is much enough.

The structural strength of the two metal wires 3 must be strong enough to bend the bent portions 52, 62 without any deformation during the pressing of the bonding portion 61. Moreover, when the bonding portion 51 abuts against a center portion of the top surface 21 arranged between the two electrodes 24 of the LED chip 2, the bonding portion 51 is adhered to the portion of the top surface 21 of the LED chip 2 by the physical property of viscosity thereof, and the bonding portion 51 and the center portion of the top surface 21 can be combined more firmly by the glue 4.

Figure 10A:
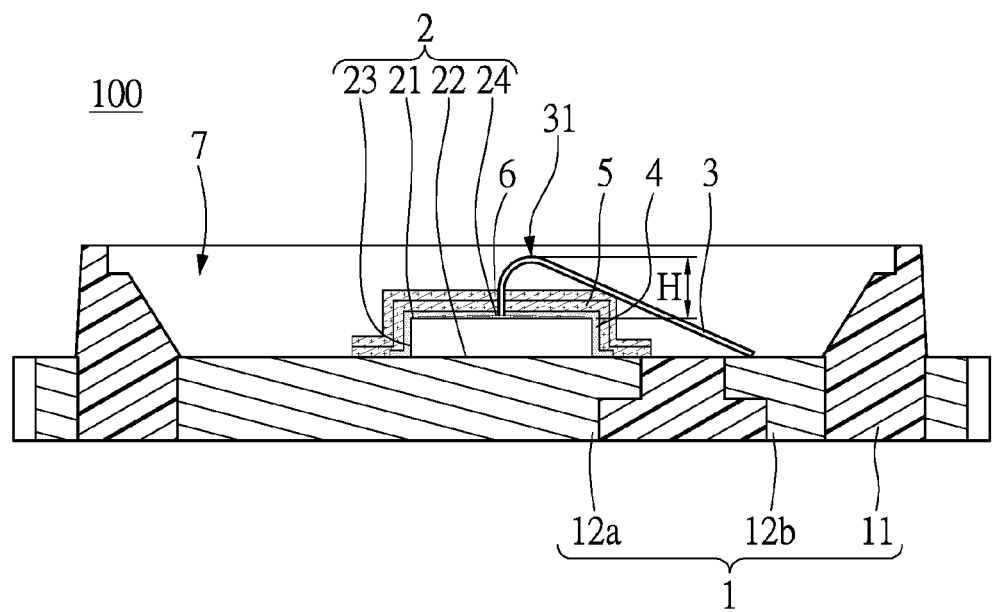
FIG. 10A is a perspective view showing step S250 of the manufacturing method of the LED package structure.

Please refer to FIG. 10A, In Step S250, a baking process is implemented to heat the first phosphor sheet 5 and the second phosphor sheet 6 (i.e., a heating condition about 50~80° C.), such that the first phosphor sheet 5 and the second phosphor sheet 6 are softened in melt state and flows along the top surface 21 and the side surface 23, and further to the bottom portion of the accommodating space 13, thereby entirely covering the top surface 21, the side surface 23, and the electrodes 24 of the LED chip 2 and further covering the bottom portion of the accommodating space 13. And then, the softened first phosphor sheet 5 and the second phosphor sheet 6 in melt state are solidified to cover the LED chip 2. Moreover, the first phosphor powders of the first phosphor sheet 5 are arranged at the inner side of the second phosphor powders of the second phosphor sheet 6.

Specifically, the softened first and second phosphor sheets 5, 6 in melt state flow along the outer surface of the LED chip 2, so that the apexes 31 of the metal wires 3 are not adhered by the phosphor powders. In other words, when the LED chip 2 is covered by the first and second phosphor sheets 5, 6 (i.e., in the covering state), a height between the top surface of the first phosphor sheet 5 and the bottom portion of the accommodating space 13 is smaller than a height between the apex 31 and the bottom portion of the accommodating space 13. That is to say, the apexes 31 of the metal wires 3 are exposed from the first phosphor sheet 5.

Additionally, when the parabolic shape of the metal wire 3 has a precipitous slope (i.e., the metal wire 3 has a shape of Q loop) in comparison to the top surface 21 of the LED chip 2, the flowing of the softened first and second phosphor sheets 5, 6 in melt state is influenced by the metal wires 3. Accordingly, the glue 4 can be used to improve the flowing of the softened first and second phosphor sheets 5, 6 in melt state, thereby the top surface 21, the two electrodes 24, and the side surface 23 of the LED chip 2 are uniformly and entirely covered by the first and second phosphor sheets 5, 6. Moreover, when the LED chip 2 is covered by the first and second phosphor sheets 5, 6 (i.e., in the covering state), a height between the top surface of the second phosphor sheet 6 and the bottom portion of the accommodating space 13 is smaller than a height between the apex 31 and the bottom portion of the accommodating space 13. That is to say, the apex 31 of the metal wire 3 is exposed from the first phosphor sheet 5 and the second phosphor sheet 6.

Figure 10B:
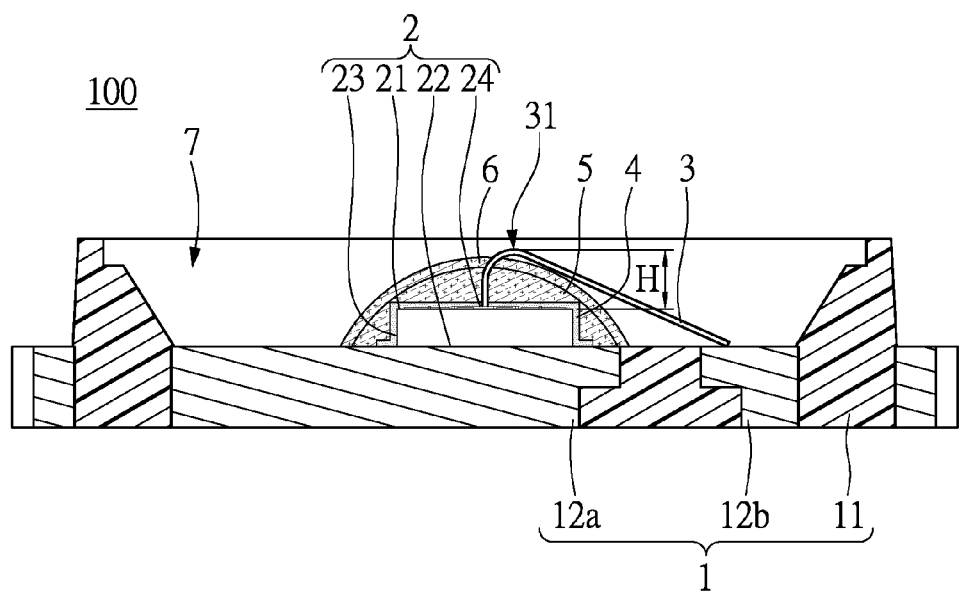
FIG. 10B is a perspective view of the LED package structure having a soft first phosphor sheet and a soft second phosphor sheet.

In addition, when the phosphor sheet bonded on the LED chip 2 is chosen with different hardness, the phosphor sheets can be formed into different shapes due to the different hardness. As shown in FIG. 10A, when a hard first phosphor sheet 5 and a hard second phosphor sheet 6 are applied to the LED chip 2, the flowing of the first phosphor sheet 5 and the second phosphor sheet 6 is corresponding to the shape of the LED chip 2, so the first phosphor sheet 5 and the second phosphor sheet 6 are solidified to form as a step construction. As shown in FIG. 10B, when a soft first phosphor sheet 5 and a soft second phosphor sheet 6 are applied to the LED chip 2, the flowing of the first phosphor sheet 5 and the second phosphor sheet 6 is not corresponding to the shape of the LED chip 2. The first phosphor sheet 5 and the second phosphor sheet 6 are solidified to form as a hemisphere construction. Based on the above description, each of the first phosphor sheet 5 and the second phosphor sheet 6 is formed by mixing the phosphor powders with the B-stage resin, so the hardness of the first phosphor sheet 5 and the second phosphor sheet 6 can be respectively adjusted by changing the composition of the B-stage resin. It should be noted that, when the total thickness T2 of the first and second phosphor sheets 5, 6 is close to the loop height H, the apex 31 may be climbed by the B-stage resin mixed with the phosphor powders of the first and second phosphor sheets 5, 6 due to the capillarity, so that the apex 31 of the metal wire 3 may be adhered with some of the phosphor powders thereon. However, the apex 31 of the metal wire 3 is substantially exposed from the first and second phosphor sheets 5, 6.

Moreover, in the instant embodiment, the first phosphor sheet 5 has yellow phosphor powders and the second phosphor sheet 6 has red phosphor powders, so the blue light emitted from the LED chip 2 can be transformed into white light after passing through the first phosphor sheet 5 and the second phosphor sheet 6. Accordingly, the LED package structure 100 has a light property of high color rendering index (CRI).

The manufacturing method of the LED package structure 100 of the second embodiment has disclosed in above description, and the LED package structure 100 prepared by the above manufacturing method of the second embodiment is also disclosed in the following description. The LED package structure 100 of the second embodiment is similar to the LED package structure 100 of the first embodiment, so the same features are not disclosed again. As shown in FIG. 8, the main difference of the two embodiments is that the first phosphor powders of the first phosphor sheet 5 is arranged at the inner side of the second phosphor powders of the second phosphor sheet 6.

[The Possible Effect of the Instant Disclosure]

In summary, the phosphor sheet of the instant disclosure is configured to cover the outer surface and the electrode of the LED chip, so by using the phosphor sheet, the LED chip can be provided without any light leakage, thereby avoiding the LED package structure being manufactured with bad color uniformity. The B-stage phosphor sheet of the instant disclosure is provided without any receiving hole, so that the phosphor sheet of the instant disclosure is prepared more easily than the conventional phosphor sheet.

Moreover, when the phosphor sheet cooperating with the LED chip that is electrically connected by wire bonding is applied to the base having a bowl construction the effect of high utilization of phosphor powder is facilitated and a problem of precipitation of phosphor powder is improved in this instant disclosure. Accordingly, a CIE measuring mechanism can be incorporated with the phosphor sheet firstly before disposing the phosphor sheet onto the LED chip, such that the CIE index can be smaller than one SCDM (Standard Deviation Color Matching)

Additionally, a plurality of phosphor sheets respectively having different light properties can be used for the manufacturing method of the LED package structure so as to control the color temperature of the LED package structure.

The descriptions illustrated supra set forth simply the preferred embodiments of the instant invention; however, the characteristics of the instant invention are by no means restricted thereto. All changes, alterations, or modifications conveniently considered by those skilled in the art are deemed to be encompassed within the scope of the instant invention delineated by the following claims.

What is claimed is:

1. An LED package structure, comprising:
   a base;
   an LED chip having at least one electrode thereon and being disposed on the base, the LED chip including a top surface, a bottom surface, and a side surface arranged between the top surface and the bottom surface;
   at least one metal wire having an apex and a loop height being defined by the apex, two opposite ends of the at least one metal wire being respectively and electrically connected to the at least one electrode of the LED chip and the base;
   a first phosphor sheet including a B-stage resin and a plurality of phosphor powders being mixed therewith, the first phosphor sheet being adhered to the LED chip by the B-stage resin capable of viscosity and covering the top surface, the side surface, and the at least one electrode of the LED chip, wherein a thickness of the first phosphor sheet is smaller than the loop height, and the apex of the at least one metal wire is exposed from the first phosphor sheet; and an encapsulation resin disposed in the base and encapsulating the LED chip, the at least one metal wire, and the first phosphor sheet.

2. The LED package structure as claimed in claim 1, wherein the at least one metal wire connects the at least one electrode of the LED chip to the base by reverse bonding, the loop height is a height between the apex of the at least one metal wire and a bonding point of the base, and the loop height is smaller than 6 mil.

3. The LED package structure as claimed in claim 1, wherein the at least one metal wire connects the at least one electrode of the LED chip to the base by forward bonding, the loop height is a height between the apex of the at least one metal wire and the top surface of the LED chip, the loop height is greater than 6 mil.

4. The LED package structure as claimed in claim 3, further comprising a glue disposed on the top surface of the LED chip, the first phosphor sheet is adhered to the LED chip by the B-stage resin and the glue.

5. The LED package structure as claimed in claim 4, wherein at least one of the glue and the B-stage resin is a phenylsiloxane resin capable of low viscosity, and the low viscosity of the glue is smaller than 10000 cP.

6. The LED package structure as claimed in claim 4, wherein the refractive index of the glue with respect to light having a wavelength of 532 nm is 1.54.

7. The LED package structure as claimed in claim 4, wherein the glue is entirely cladded by the first phosphor sheet.

8. The LED package structure as claimed in claim 4, wherein the refractive index of the B-stage resin with respect to light having a wavelength of 532 nm is 1.56.

9. The LED package structure as claimed in claim 4, wherein an amount of the glue is approximately equal to an area of the top surface of the LED chip multiplied by a thickness of the glue.

10. The LED package structure as claimed in claim 9, wherein the thickness of the glue is approximately 100 μm.

11. The LED package structure as claimed in claim 1, wherein a shape of the first phosphor sheet is corresponding to a shape of the LED chip, the first phosphor sheet is solidified to form as a step construction, and the first phosphor sheet is configured to entirely shield the LED chip.

12. The LED package structure as claimed in claim 1, wherein the first phosphor sheet is solidified to form as a hemisphere construction, and the first phosphor sheet is configured to entirely shield the LED chip.

13. The LED package structure as claimed in claim 1, wherein the apex of the at least one metal wire is not adhered by the phosphor powders.

14. The LED package structure as claimed in claim 1, further comprising a second phosphor sheet adhered to the first phosphor sheet, wherein an optical property of the first phosphor sheet is different from that of the second phosphor sheet, a total thickness of the first phosphor sheet and the second phosphor sheet is smaller than the loop height, and the apex of the at least one metal wire is exposed from the first and second phosphor sheets.

15. The LED package structure as claimed in claim 14, wherein the first phosphor sheet and the second phosphor sheet are solidified to form as a step construction corresponding to the shape of the LED chip.

16. The LED package structure as claimed in claim 15, further comprising a glue disposed on the top surface of the LED chip, the first phosphor sheet is adhered to the LED chip by the B-stage resin and the glue, the glue is entirely cladded by the first phosphor and is formed as a step construction corresponding to the shape of the LED chip.

17. The LED package structure as claimed in claim 14, wherein the first phosphor sheet and the second phosphor sheet are solidified to form as a hemisphere construction.

18. The LED package structure as claimed in claim 17, further comprising a glue disposed on the top surface of the LED chip, the first phosphor sheet is adhered to the LED chip by the B-stage resin and the glue, the glue is entirely cladded by the first phosphor and is formed as a step construction corresponding to the shape of the LED chip.

19. The LED package structure as claimed in claim 1, wherein the base comprises a reflecting body and a pair of lead frames, the pair of lead frames includes a first lead frame and a second lead frame arranged apart from each other and partially embedded in the reflecting body.

20. The LED package structure as claimed in claim 19, wherein each of the first lead frame and the second lead frame is formed with two penetrating holes for being firmly fixed with the reflecting body.

* * * * *